(12) United States Patent
Mevay et al.

(10) Patent No.: US 7,667,444 B2
(45) Date of Patent: Feb. 23, 2010

(54) CAPACITIVE LOAD DRIVING DEVICE

(76) Inventors: Alex Mevay, 1395 Boylston St., Boston, MA (US) 02215; John C. Olsson, 215 Irvine Ave., Closter, NJ (US) 07624; F. Joseph Pompei, 16 Peck Ave., Wayland, MA (US) 01778

( * ) Notice: Subject to any disclaimer, the term of this patent is extended or adjusted under 35 U.S.C. 154(b) by 115 days.

(21) Appl. No.: 11/906,099

(22) Filed: Sep. 28, 2007

(65) Prior Publication Data

US 2008/0278202 A1    Nov. 13, 2008

Related U.S. Application Data

(60) Provisional application No. 60/847,976, filed on Sep. 28, 2006.

(51) Int. Cl.
| | |
|---|---|
| G05F 1/00 | (2006.01) |
| H03B 19/00 | (2006.01) |
| H03F 3/38 | (2006.01) |
| H03M 1/66 | (2006.01) |

(52) U.S. Cl. .................. 323/283; 327/111; 330/10; 341/151

(58) Field of Classification Search ............ 323/271, 323/282, 283, 351, 241–243, 288, 326; 330/10; 327/108, 111, 175; 341/151, 152
See application file for complete search history.

(56) References Cited

U.S. PATENT DOCUMENTS

| | | | | |
|---|---|---|---|---|
| 5,148,170 A | * | 9/1992 | Leopold et al. | ............ 341/157 |
| 5,650,739 A | * | 7/1997 | Hui et al. | .................. 327/262 |
| 6,661,285 B1 | | 12/2003 | Pompei et al. | |
| 6,853,570 B2 | * | 2/2005 | De Vries | .................. 363/131 |

OTHER PUBLICATIONS

Pao-Szu Wu, Towards Rom-Less DDFSs On compact digital circuits for accurate sine approximation, Washington State University, School of Electrical Engineering and Computer Science, Dec. 2003.
Raab, Radio Frequency Pulse Width Modulation, IEEE Transactions on Communications, Aug. 1973, pp. 958-966.

* cited by examiner

Primary Examiner—Jessica Han
Assistant Examiner—Emily Pham
(74) Attorney, Agent, or Firm—Weingarten, Schurgin, Gagnebin & Lebovici LLP

(57) ABSTRACT

An improved capacitive load driving device that provides increased signal voltage gain, over-voltage, over-current, and over-temperature protections, over-modulation prevention, output level control, minimized harmonic generation, and compensation for propagation medium distortion. The device includes driver/amplifier circuitry, protection circuitry, and an output stage. The driver/amplifier circuitry simultaneously modulates and discretizes an analog input signal by comparing it with a specified digitally-synthesized modulation waveform, which is a repeating series of approximately parabolic waveforms. The resulting PWM waveform is processed to generate a discrete low-harmonic sine wave approximation used to produce gate drive signals for the output stage. The protection circuitry monitors the device for fault conditions, and, in the event a fault condition is detected, controls startup and automatic shutdown. The output stage includes an H-bridge that drives an impedance-matching transformer feeding an inductor. When the device is used to drive a capacitive transducer, the impedance-matching transformer, the inductor, and the transducer form a series-resonant circuit for boosting the signal voltage gain, reducing power consumption, and filtering higher harmonics.

5 Claims, 19 Drawing Sheets

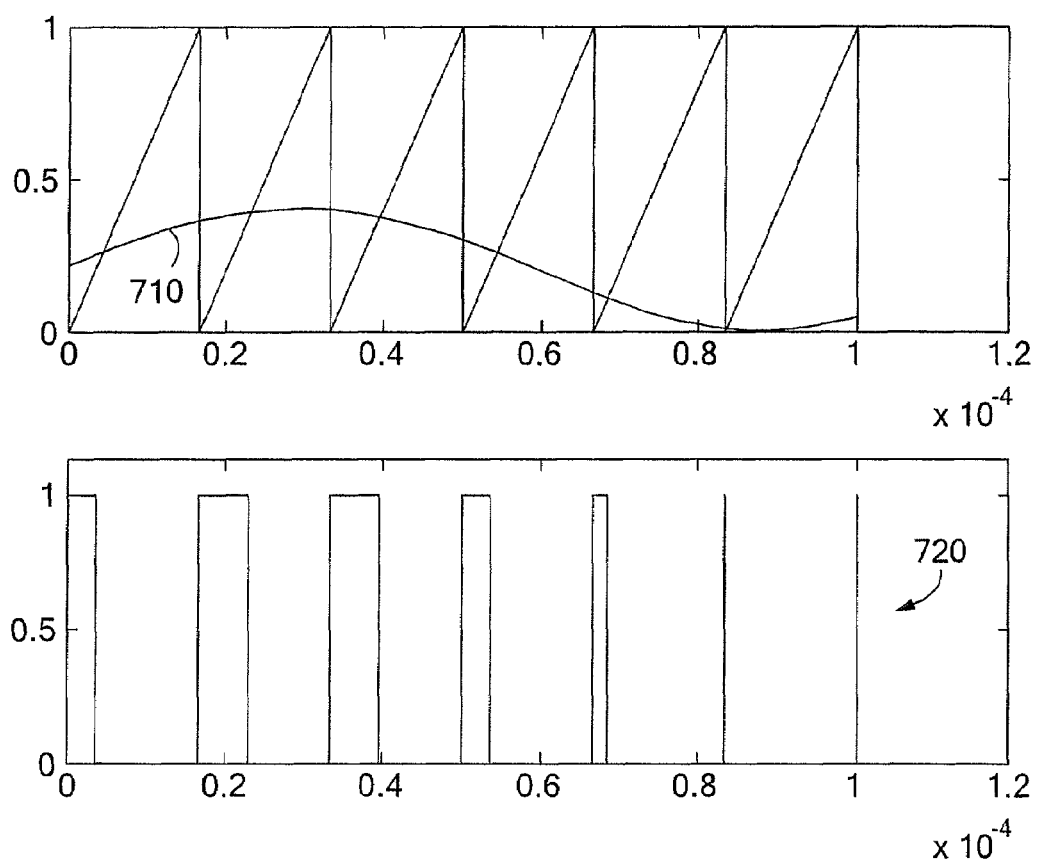
FIG. 7a - Prior art

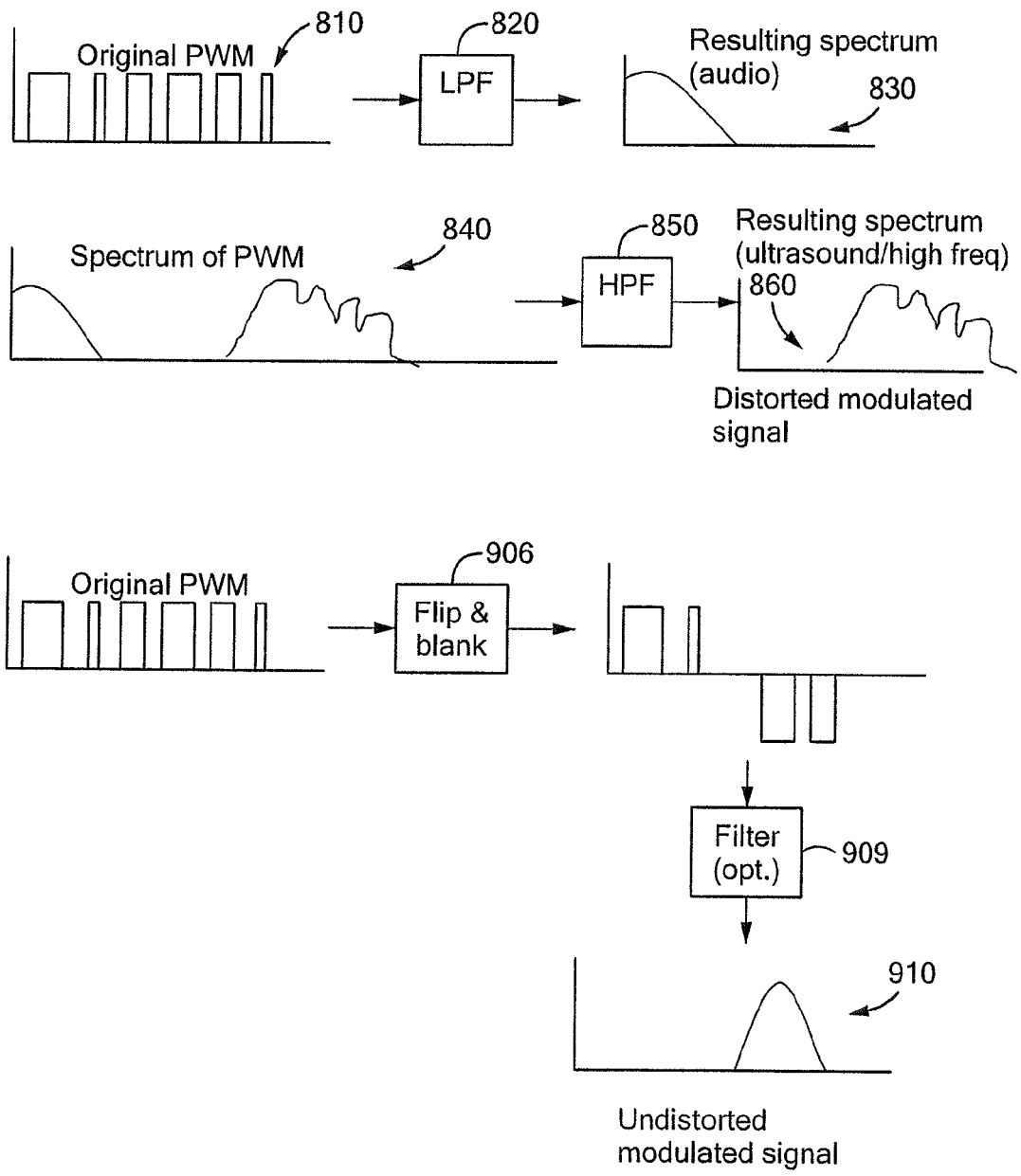
*FIG. 8 - Prior art*

CAPACITIVE LOAD DRIVING DEVICE

CROSS REFERENCE TO RELATED APPLICATIONS

This application claims benefit of U.S. Provisional Patent Application No. 60/847,976 filed Sep. 28, 2006 entitled CAPACITIVE LOAD DRIVING DEVICE.

STATEMENT REGARDING FEDERALLY SPONSORED RESEARCH OR DEVELOPMENT

Not applicable

BACKGROUND OF THE INVENTION

The present invention relates generally to devices and methods for driving reactive loads, and more specifically to a highly efficient power amplifier configured to drive capacitive loads. The present invention can be optimized for use in a parametric loudspeaker system.

U.S. Pat. No. 6,661,285 (the "'285 patent") issued Dec. 9, 2003 entitled POWER EFFICIENT CAPACITIVE LOAD DRIVING DEVICE discloses a general purpose power-efficient driver for reactive, usually capacitive, loads that employs a switching scheme to deliver power to the load. The power-efficient driver disclosed in the '285 patent may be employed in a parametric audio system that includes a modulator for modulating an ultrasonic carrier signal with an audio signal, a driver amplifier for amplifying the modulated ultrasonic signal, and one or more acoustic transducers (e.g., capacitive transducers) configured to receive the amplified ultrasonic signal and project it through the air along a selected path. Because of the non-linear propagation characteristics of the air, the modulated ultrasonic carrier signal is demodulated as it passes through the air, thereby regenerating the audio signal along the selected path of projection. As disclosed in the '285 patent, the switching scheme includes a plurality of switches that can be arranged in an "H-bridge" or any other suitable arrangement, and the control scheme for the switches can be optimized with regard to desired signal characteristics and design goals, which are generally to maximize accuracy of the intended signal and to minimize power consumption. The capacitive load driving device disclosed in the '285 patent may be employed in a number of applications such as sonar control systems, RF transmission systems, parametric audio systems, etc.

Although the capacitive load driving device disclosed in the '285 patent has been successfully employed to drive capacitive loads in a more power efficient manner, it would be desirable to have an improved capacitive load driving device and method that provides increased signal voltage gain, over-voltage, over-current, and over-temperature protections, over-modulation prevention, output level control, minimized harmonic generation, and compensation for propagation medium distortion.

BRIEF SUMMARY OF THE INVENTION

In accordance with the present invention, an improved capacitive load driving device and method is disclosed that provides increased signal voltage gain, over-voltage, over-current, and over-temperature protections, over-modulation prevention, output level control, minimized harmonic generation, and compensation for propagation medium distortion. The presently disclosed capacitive load driving device can be optimized for use in a parametric loudspeaker system.

In one embodiment, the capacitive load driving device includes driver/amplifier circuitry, protection circuitry, power supply circuitry, and an output stage. The driver/amplifier circuitry includes a complex programmable logic device (CPLD), a digital-to-analog converter (DAC), and a comparator. The CPLD, the DAC, and the comparator are configured and arranged for simultaneously modulating and discretizing an analog input signal by comparing it with a specified digitally-synthesized modulation waveform. In conventional systems, the modulation waveform is typically a ramp, sawtooth, or triangular waveform. Such conventional systems typically include a pre-distortion section, usually prior to modulation, that corrects for the distortion resulting from demodulation by the propagation medium. Such distortion is generally approximately quadratic, and can typically be corrected by a curve approximating a square root function. In the presently disclosed capacitive load driving device, the ramp or sawtooth function is replaced by a repeating series of approximately parabolic waveforms, thereby obviating the need for the pre-distortion section of conventional systems, and reducing the overall cost and complexity of the system.

Accordingly, in the presently disclosed embodiment, the digitally-synthesized modulation waveform is a repeating series of parabolic waveforms. The resulting duty-cycle pulse width modulated (PWM) waveform is processed to generate a discrete low-harmonic sine wave approximation, which in turn is used to produce MOSFET gate drive signals for the output stage. The protection circuitry includes a microcontroller operative to monitor the device for fault conditions, and, in the event a fault condition is detected, to control startup and automatic shutdown for improved operator safety. The power supply circuitry comprises the internal power supply for the circuit. In the disclosed embodiment, the power supply circuitry takes its power from an external switching AC/DC adaptor. The power supply is clocked by digital logic to minimize interference, and to eliminate beating with a carrier frequency. In the disclosed embodiment, the output stage includes an N-MOSFET "H-bridge" having suitable gate-drive circuitry. The H-bridge is configured to drive an impedance-matching transformer feeding an inductor. When driving a capacitive transducer, the impedance-matching transformer, the inductor, and the transducer form a series-resonant circuit that can be employed to boost the output signal voltage gain, reduce power consumption, and automatically filter higher harmonics.

The presently disclosed capacitive load driving device employs a switching algorithm adapted to provide distortion corrections for an output device (e.g., an antenna or capacitive transducer), the signal propagation medium (e.g., air or water), or any other suitable component in the transmission chain. The need for separate processing circuitry is therefore eliminated, reducing system cost and complexity. Further, the parabolic waveforms, when used with a functionally linear switching stage, naturally compensate for quadratic distortion, which generally exists in systems with a square-law distortion such as parametric audio systems.

Many output devices (e.g., antennas, capacitive transducers) are sensitive to over-voltage conditions, which can cause damage to system components. As such, it is desirable to carefully limit the possible output levels of the system. Conventional systems typically include "clipping" circuitry for this purpose. However, such clipping circuitry is undesirable because it can generate substantial odd harmonics, which can also be damaging to system components. Instead, to protect the output device such as an antenna or capacitive transducer, pulse blanking can be used with thresholds continuously adapting to the overall system gain or component variations. Such pulse blanking can be employed to limit output levels to a pre-set maximum.

To prevent over-modulation, the presently disclosed capacitive load driving device can be configured for adaptively maintaining a minimum pulse width. In addition, the disclosed device can be configured to include an exponential referenced level control so that any controls on output are self-similar and overall system gain-independent.

In the presently disclosed embodiment, the capacitive load driving device employs a twin-pulse scheme in the PWM to minimize harmonics up to at least the 5$^{th}$ harmonic, and to avoid the need for nonlinear correction to the switching stage, as typically required in conventional systems. The relationship between the twin-pulse duty cycle and the fundamental amplitude is functionally linear, and the 3$^{rd}$ harmonic is substantially completely eliminated. By replacing the conventional single-pulse-per-cycle scheme with a two-pulses-per-half-cycle scheme, the disclosed device is unaffected for practical purposes by switching-scheme induced distortion. It is noted that the twin-pulse scheme can be reduced to a single pulse for low-amplitude signals, or increased to more pulses for high-amplitude signals. In these cases, a similar pulse synthesis technique can be used to eliminate switching distortion, without requiring nonlinear corrections.

Other features, functions, and aspects of the invention will be evident from the Detailed Description of the Invention that follows.

BRIEF DESCRIPTION OF THE SEVERAL VIEWS OF THE DRAWINGS

The invention will be more fully understood with reference to the following Detailed Description of the Invention in conjunction with the drawings of which:

FIG. 2c is a schematic diagram of common-mode and DC balance circuitry included in the driver/amplifier circuitry of FIG. 2a;

FIG. 2d is a schematic diagram of modulator DC balance integrator circuitry included in the driver/amplifier circuitry (peak detect/slow decay) of FIG. 2a;

FIG. 2e is a schematic diagram of output level comparator circuitry included in the driver/amplifier circuitry of FIG. 2a;

FIG. 2f is a schematic diagram of level control digital-to-analog converter (DAC) circuitry included in the driver/amplifier circuitry of FIG. 2a;

FIG. 7a is an illustration of a conventional PWM generation scheme, depicting a sawtooth wave, an audio signal, and a resulting PWM output;

FIG. 8 is an illustration of a conventional PWM scheme including a low pass filter that regenerates an original audio signal, the spectrum of the conventional PWM sequence, which can be high pass filtered to retain a modulated signal (distorted), and a "flip and blank" sequence applied to the pulses according to the present invention, which is optionally filtered to produce an undistorted modulated signal;

DETAILED DESCRIPTION OF THE INVENTION

The entire disclosure of U.S. Provisional Patent Application No. 60/847,976 filed Sep. 28, 2006 entitled CAPACITIVE LOAD DRIVING DEVICE is incorporated herein by reference.

An improved capacitive load driving device is disclosed that provides increased signal voltage gain, over-voltage, over-current, and over-temperature protections, over-modulation prevention, output level control, minimized harmonic generation, and compensation for propagation medium distortion. In one embodiment, the presently disclosed capacitive load driving device can be optimized for use in a parametric loudspeaker system.

Figure 1:
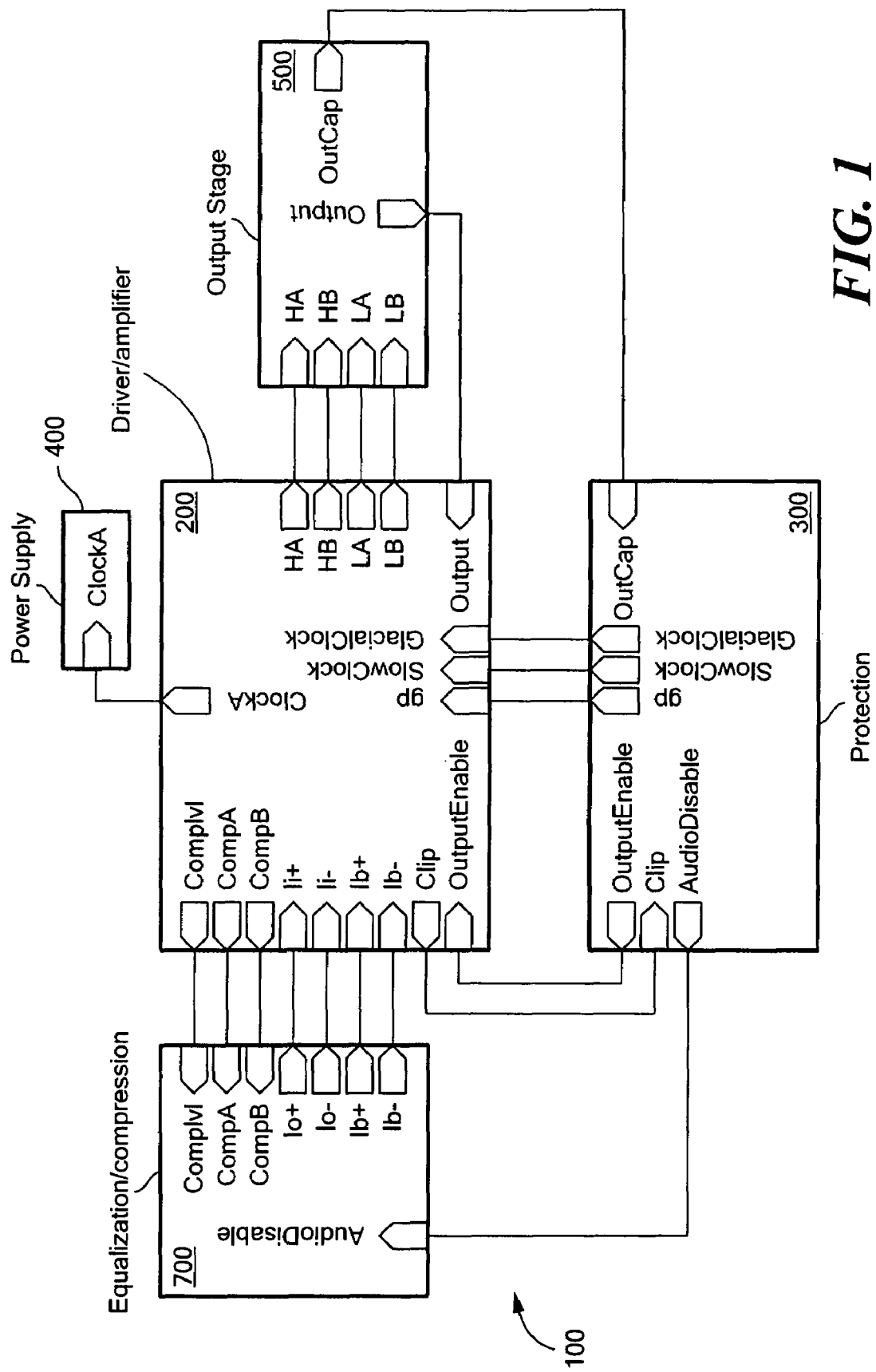
FIG. 1 is a block diagram of an improved capacitive load driving device according to the present invention.

FIG. 1 depicts an illustrative embodiment of a capacitive load driving device 100, in accordance with the present invention. The capacitive load driving device 100 includes driver/amplifier circuitry 200, protection circuitry 300, power supply circuitry 400, and an output stage 500. In the illustrated embodiment, the driver/amplifier circuitry 200 is configured to perform an approximate square root on an incoming analog signal (to correct for atmospheric effects), to modulate the incoming signal to generate a time-domain discrete signal, to perform bit sequencing to form a low-harmonic discrete sine wave, and to generate gate drive signals for use in the output stage 500. The driver/amplifier circuitry 200 is further configured to add offset to keep the incoming signal from over-modulating, as in conventional peak-detect circuits, and to protect the output from an over-voltage condition. In addition, the driver/amplifier circuitry 200 is configured for adaptively controlling a control reference level to optimize the output levels. As shown in FIG. 1, the capacitive load driving device 100 further includes equalization and compression circuitry 700, which is configured to receive the incoming analog signal, and to apply equalization and/or compression, as desired. It is noted that such equalization and/or compression can be applied to the incoming analog signal using conventional audio techniques.

The primary function of the driver/amplifier circuitry 200 is to modulate the analog input signal into a discrete, sampled, analog, time-domain signal capable of being used to drive the output stage 500. The driver/amplifier circuitry 200 accomplishes this as follows. The analog input signal is summed with a modulation waveform and zero-crossings are tracked to generate a PWM representation of the signal. This is similar to the conventional use of a ramp, saw tooth, or triangle waveform to generate a PWM waveform for use in power supplies or switching audio amplifiers. In the presently disclosed embodiment, optimized for parametric audio systems, the driver/amplifier circuitry 200 is configured, in effect, to take the approximate square root of the input signal to correct for atmospheric demodulation effects, resulting in an accurate audio output signal. By replacing the conventional ramp, saw tooth, or triangle waveform with a repeating series of parabolic waveforms, a square root relationship can be obtained going from voltage to duty cycle.

Figure 6:
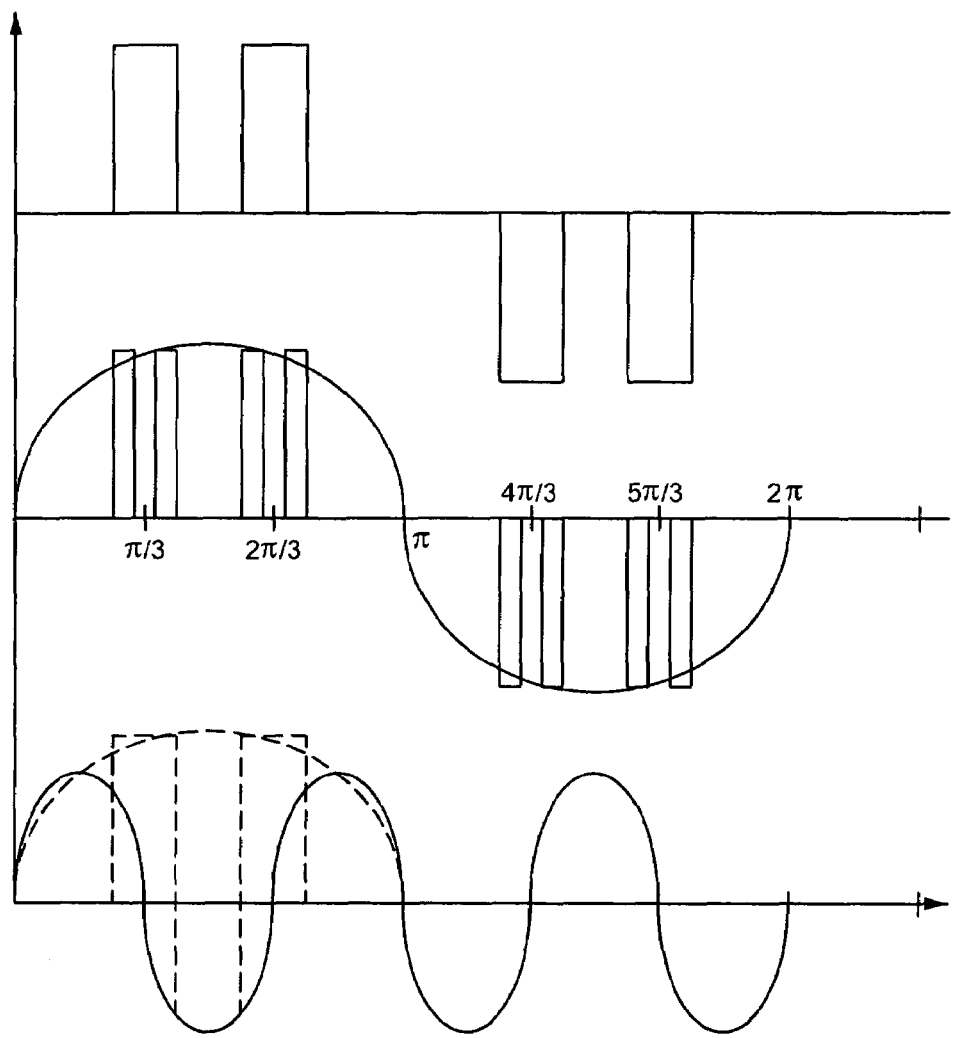
FIG. 6 is an illustration of a twin-pulse scheme employed in the PWM performed by the capacitive load driving device of FIG. 1.

FIG. 6 depicts an exemplary signal comprised of selectively flipped and/or blanked pulses and a corresponding sine wave output, as generated by the PWM waveform. It is noted that conventional devices typically employ a single pulse-per-cycle pattern, including a single positive pulse centered at about $\pi/2$ in the positive half-cycle of the analog input signal, and a single negative pulse centered about $3\pi/2$ in the negative half-cycle of the signal. As shown in FIG. 6, the capacitive load driving device 100 employs two pulses in each half-cycle, in which the first pair of pulses is positive and centered at about $\pi/3$ and $2\pi/3$, respectively, and the second pair of pulses is negative and centered at about $4\pi/3$ and $5\pi/3$, respectively. In the presently disclosed embodiment, this results in a functionally linear switching stage that does not require non-linear corrections. A detailed description of the "flip and blank" technique can be found in the Appendix to this specification.

FIG. 7a depicts a typical method of PWM amplification. In this case, a ramp (or triangle) wave is compared to the audio signal 710. The result of the comparison is illustrated as a series of pulses 720.

Figure 7B:
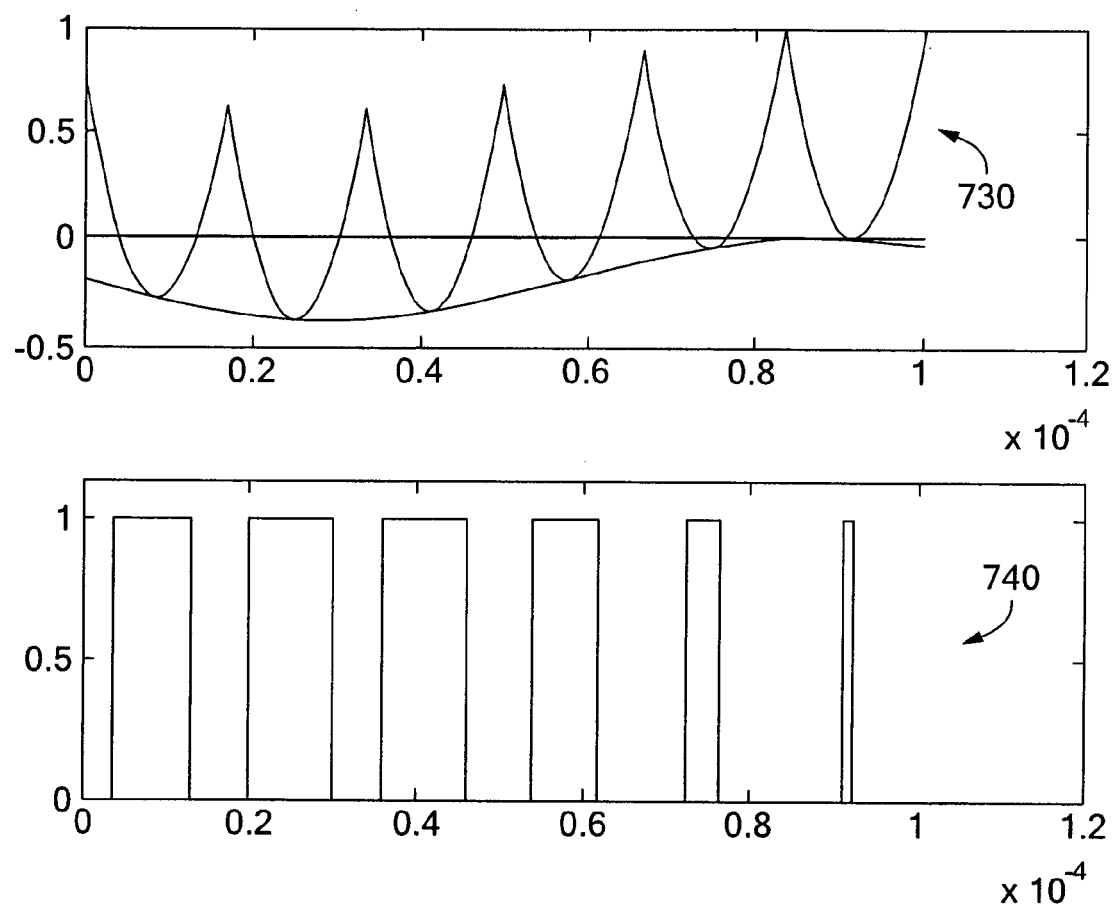
FIG. 7b is an illustration of a PWM generation scheme according to the present invention, depicting a series of parabolic waveforms summed (or differenced) to an offset audio signal, and the resulting pulses.

FIG. 7b depicts an improved method of PWM amplification, in accordance with the present invention. As shown in FIG. 7b, the ramps/triangles have been replaced by parabolas, and rather than comparing the signals directly, they are instead summed (or subtracted). FIG. 7b depicts the parabolic curves 730, and the resulting pulses 740, as they correspond to zero crossings. This creates the PWM signal, which is then processed before driving the output stage 500 (preferably an "H-bridge" 510; see FIG. 5a).

Figure 2A:
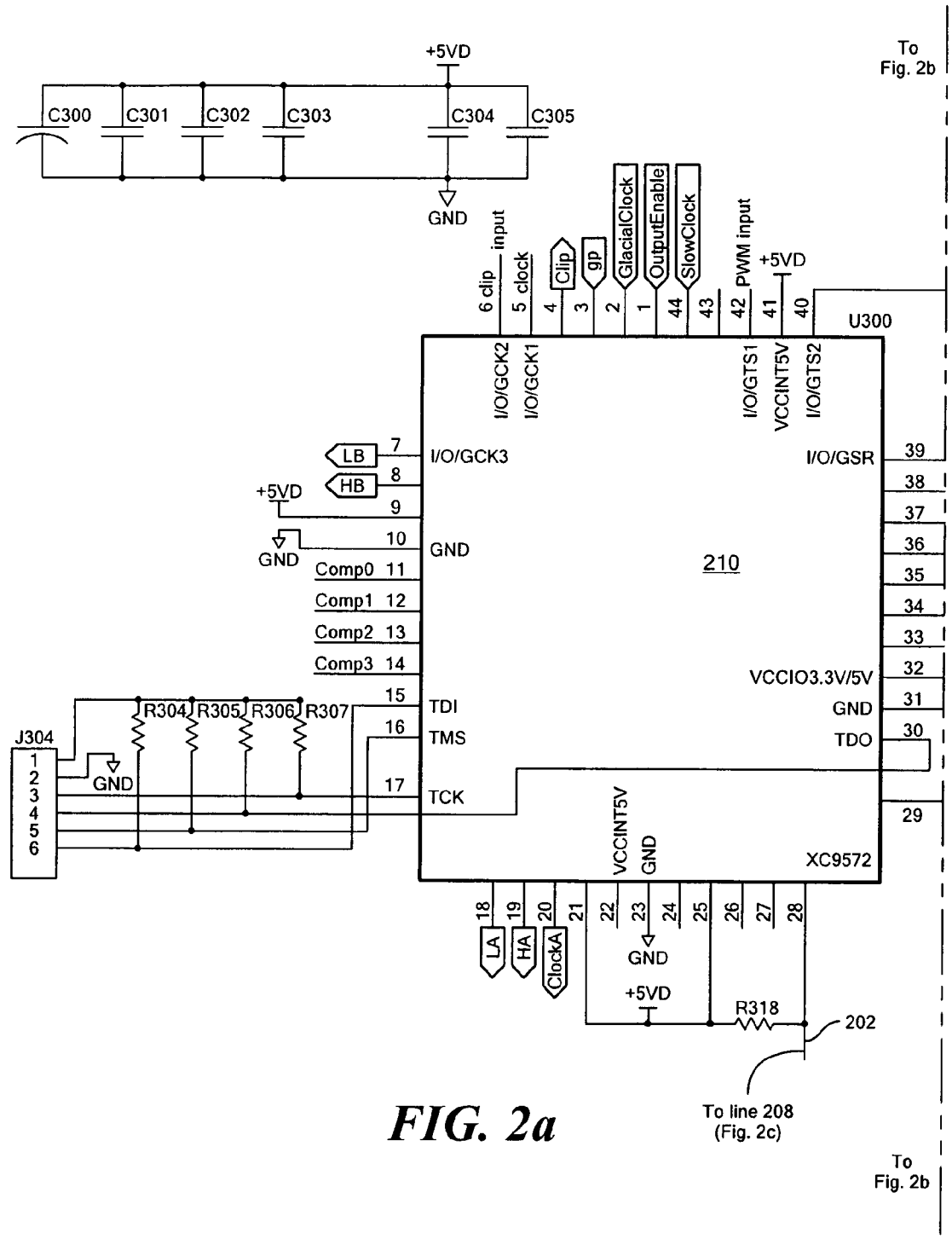
FIGS. 2a-2b are schematic diagrams of driver/amplifier circuitry included in the capacitive load driving device of FIG. 1.
Figure 2B:
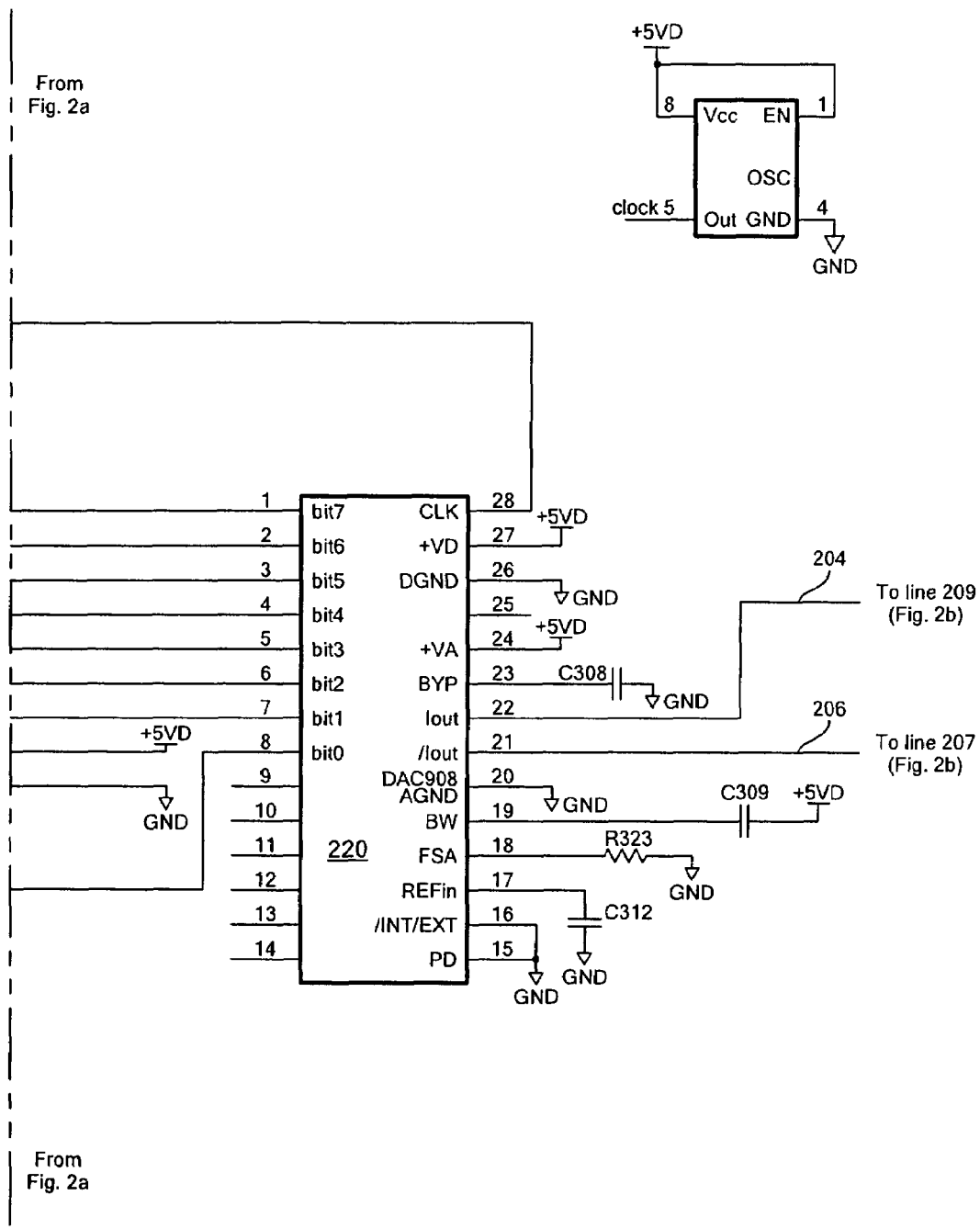

With reference to FIGS. 2a-2b, the driver/amplifier circuitry 200 includes a complex programmable logic device (CPLD) 210, and a digital-to-analog converter (DAC) 220. For example, the CPLD 210 may be any suitable CPLD device sold by Xilinx, Inc., San Jose, Calif., USA, or any other suitable CPLD device. Further, the DAC 220 may be implemented using the TI DAC908 sold by Texas Instruments Incorporated, Dallas, Tex., USA, or any other suitable DAC. It is noted that a line 202 depicted at the bottom of FIG. 2a can be used to add a peak-detect offset, as discussed below. In the presently disclosed embodiment, the CPLD 210 functions like a ROM, feeding bytes of data to the DAC 220. Although a ROM is not a typical use for a CPLD, the high speeds, the relatively small amount of data, and the resulting integration make such use beneficial in the capacitive load driving device 100. In the illustrated embodiment, the DAC 220 is capable of 165MSPS at 8 bits, and has complementary current outputs with roughly a +/−1V compliance.

Figure 2C:
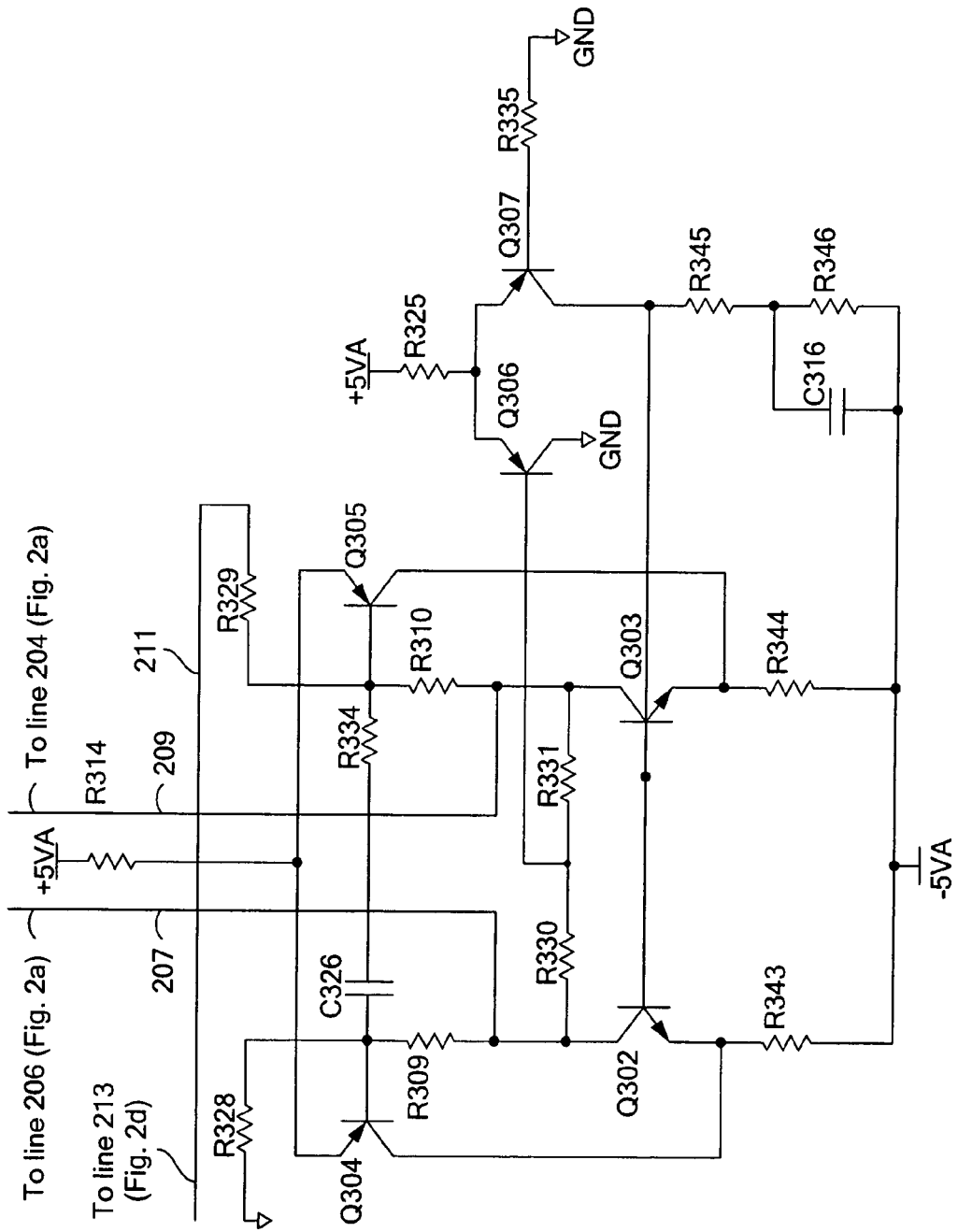
Figure 2D:
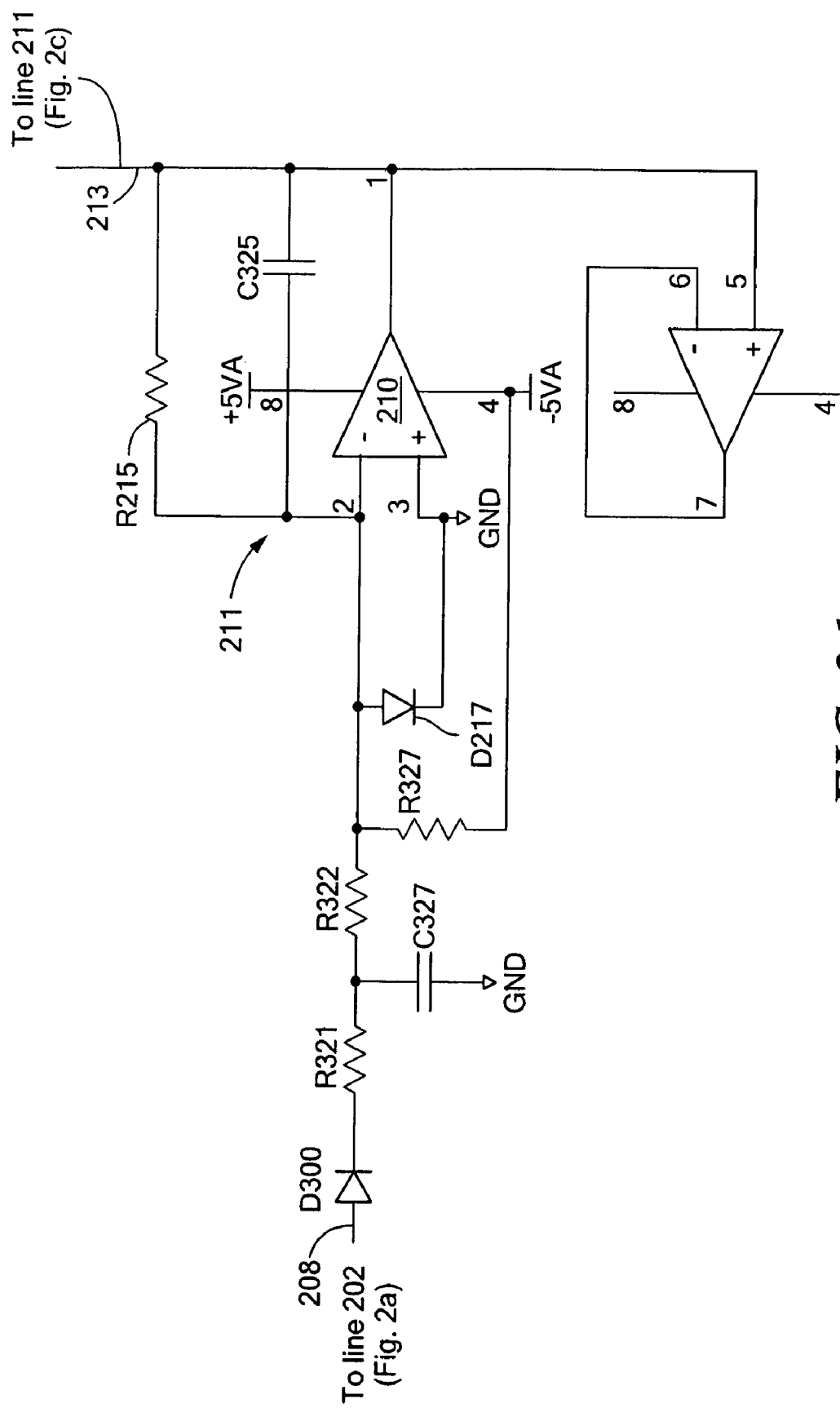
Figure 2E:
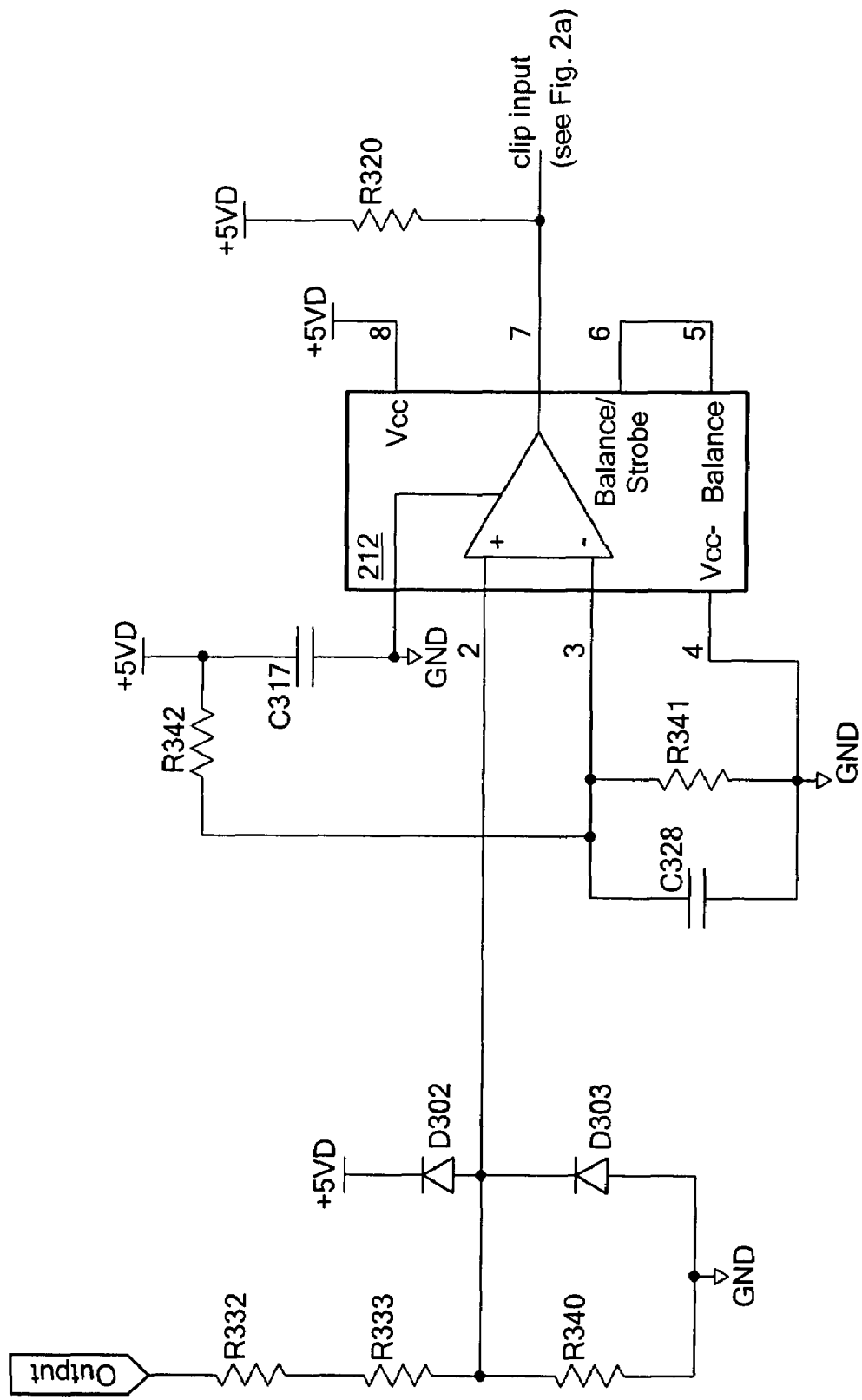

Because the parabolic waveforms used to generate the PWM waveform are implemented as a continuous waveform, a conventional stepped DAC output is not employed. Instead, the current outputs 204, 206 from the DAC 220 (see FIG. 2b) feed respective capacitors C290, C292 (see FIG. 2g), which integrate the current output to produce a smooth, piecewise-linear waveform, with no filtering required. The DAC 220 is still required to be fairly fast; however, it need not have much precision. The ability to perturb the modulation waveform from repeated parabolas offers the possibility of correcting for a wide range of nonlinearities, including those in the air, from a capacitive transducer, and from other sources. It is noted that the DAC 220 can also be used to cancel the supply-voltage dependent gain of the output stage 500.

Once the PWM signal is created, it is processed to drive the output stage 500. FIG. 8 depicts a simplified view of this process, comparing it with traditional (simplified) Class D amplifiers. Specifically, FIG. 8 depicts a pulse train 810 fed into a low-pass filter 820, which recovers the original audio signal 830. FIG. 8 also depicts a more detailed view. Before filtering, the standard (or modified) PWM scheme naturally creates a modulated signal 840 at ultrasonic frequencies. If it is desired to recover this modulated signal, then a high-pass or band-pass filter 850 (HPF or BPF) can be used to recover the modulated signal. However, this signal will generally have a large degree of distortion in the form of harmonics 860. According to the present invention, a "flip/blank" technique is employed, as described below, which includes deciding, for each pulse, whether the pulse will be transmitted, suppressed, or negated. In one embodiment, the pattern 870 is a series of six pulses, "+", "+", "0", "−", "−", "0". This recreates an accurately modulated signal 880, without requiring nonlinear corrections or complex filtering.

Figure 9A:
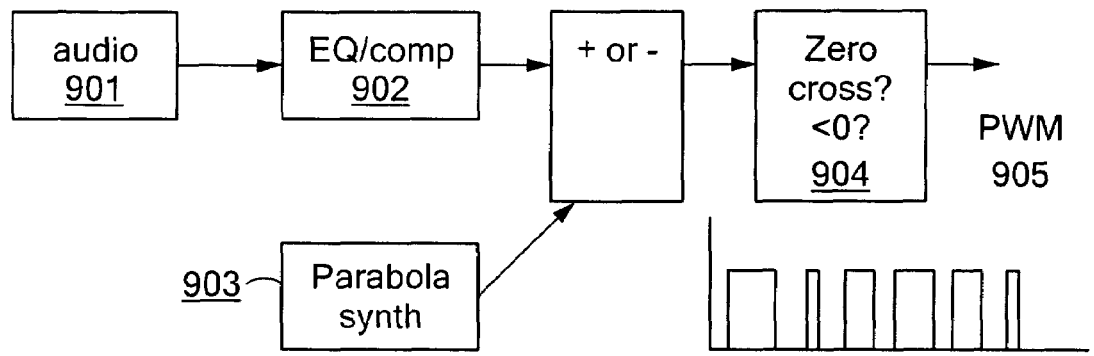
FIG. 9a depicts an initial signal path, in which the audio is passed through an EQ/compressor, summed with a parabolic waveform series (and offset), and pulses synthesized from zero-cross locations.
Figure 9B:
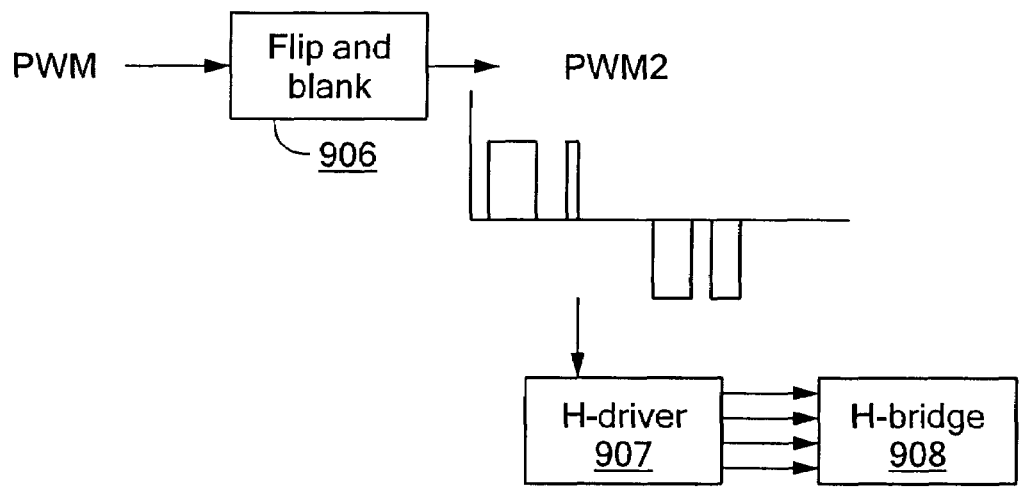
FIG. 9b depicts the PWM pulse train that is modified using the "flip and blank" technique according to the present invention using a 6-element sequence, and the modified PWM signal that is provided in turn to an H-bridge driver/decoder and an H-bridge.

FIGS. 9a-9b depict a basic functional process, for which many implementations can be made. The audio signal 901 is fed into a basic EQ/compression 902, a synthesizer 903 creates the parabolic chain, which is summed with the (offset) audio (or subtracted). The combined signal is then sent to block 904, which tracks zero-crossings and creates the desired PWM signal 905. While the pattern 870 is described herein as a series of six pulses, "+", "+", "0", "−", "−", "0", it should be appreciated that other techniques could be used, such as a 4-element series, or multiple element series with multiple levels (rather than just +1, 0, −1, it may be +2, +1, 0, −1, −2, etc.). Integer multiples of pulse widths can also be adjusted. Non-integer multiples of pulse widths and irregular timing can also be employed.

In the presently disclosed embodiment, the CPLD 210 receives the modulated waveform from a comparator as a PWM signal at approximately 6 times the carrier frequency. Because the signal has had all of the necessary processing and has been square rooted, all that remains is to convert it to a low-distortion sine wave signal suitable for driving the H-bridge 510. This is done in a way that inherently prevents distortion as experienced in prior systems. For example, start with a string of 6 positive pulses, which represents one cycle of the sine wave, and let the first pulse be centered at about 0 degrees. Next, blank or zero-out the third and sixth pulses, leaving two pairs of pulses centered at about 0, 60, 180, and 240 degrees, respectively. The second pair of pulses is then flipped negative to obtain the following waveform:

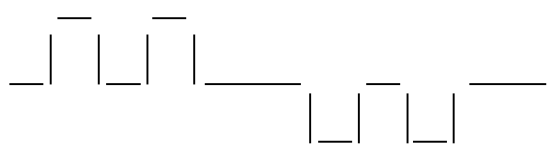

By putting these together, a discrete representation of a sine wave can be obtained. The duty cycle can vary continuously to change the amplitude of the fundamental. This particular modulation scheme, which is only one of a general class (for example, one pulse per half cycle), naturally has no second, third, or fourth harmonics. It is believed that all even and 3N harmonics are absent, leaving the fifth, seventh, and eleventh harmonics as the first few. These vary depending on the duty cycle, but are now easy to filter out. The CPLD 210 and the flip/blank decoder 906 perform this bit sequencing on a PWM input of the CPLD 210, send the signal to H-driver 907 (which can be implemented in software in the CPLD 210), which then generates four output signals (HA, HB, LA, LB) suitable for driving an H-bridge 908 (corresponding to the H-bridge 510; see FIG. 5a) to create the discrete sine wave. In the presently disclosed embodiment, the CPLD 210 is configured to perform these (and additional) tasks internally, but the implementation can also be done with discrete separate circuitry, for example, DSP's, etc. When necessary, any additional distortion can be corrected by changing the modulation waveform, using conventional techniques.

Because it is desirable to prevent over-modulation, and to permit square-root-like operation, the effective modulation signal needs a dynamic offset. In the presently disclosed embodiment, this offset increases quickly from increases in audio level, and decays slowly. This prevents over-modulation and processing errors, while assuring that when no sound is to be produced by the system, little or no ultrasound is output. Such processing is accomplished by modifying the nominal duty cycle of the pulses. The nominal duty cycle can be electronically adjusted by the peak detect function, as discussed below. As the signal level changes in amplitude, the nominal duty cycle is adjusted to match, so only as much level is used as is necessary to prevent the signal from over-modulating the carrier.

The CPLD 210 is also configured to tune the modulator DC balance to match the incoming analog signal. The CPLD 210 monitors the incoming PWM waveform from the comparator 280 (see FIG. 2g). If the duty cycle becomes too low, i.e., too close to over-modulation, then the CPLD 210 generates a series of pulses, e.g., TTL pulses, that increase in width as the duty cycle further decreases. This produces a gradual peak detect, which would generally eliminate unwanted noise ("pops") during fast transitions. These TTL pulses enter the modulator DC balance integrator circuitry of FIG. 2d on a line 208. The pulses are filtered slightly for input to a relatively slow op amp 210, and integrated to produce the command level for the DC balance, which drives the DC balance circuit depicted in FIG. 2c. When the CPLD 210 is not outputting pulses, a resistor R215 (see FIG. 2d) causes the command level for DC balance level (and thus ultrasound, for a parametric device) to slowly decrease until the pulses begin again.

In addition, the CPLD 210 is configured to monitor the output to protect the capacitive transducer from excess voltage. This function is achieved using a comparator 212 (see FIG. 2e), which feeds an input of the CPLD 210. If the output voltage exceeds a specified threshold, then the CPLD 210 will adaptively reduce its duty cycle limit, thereby reducing the maximum output voltage.

Figure 2F:
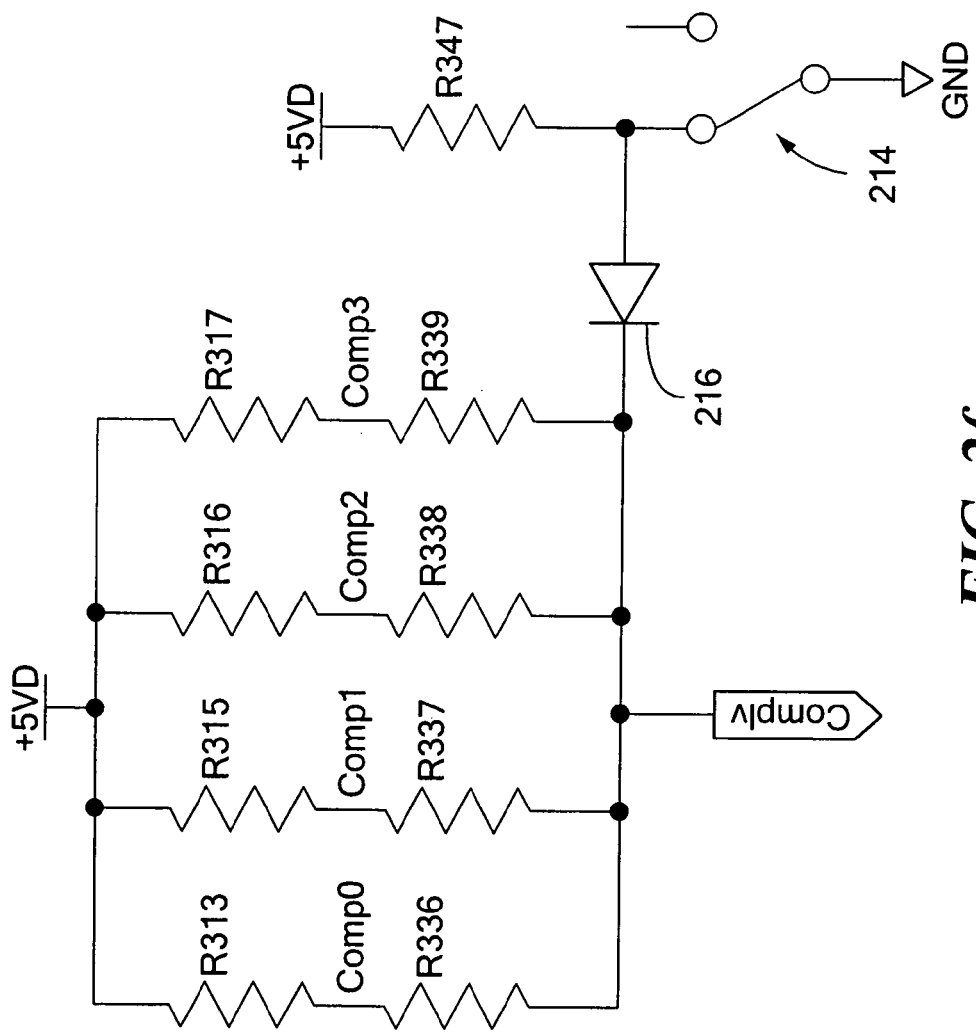
Figure 2G:
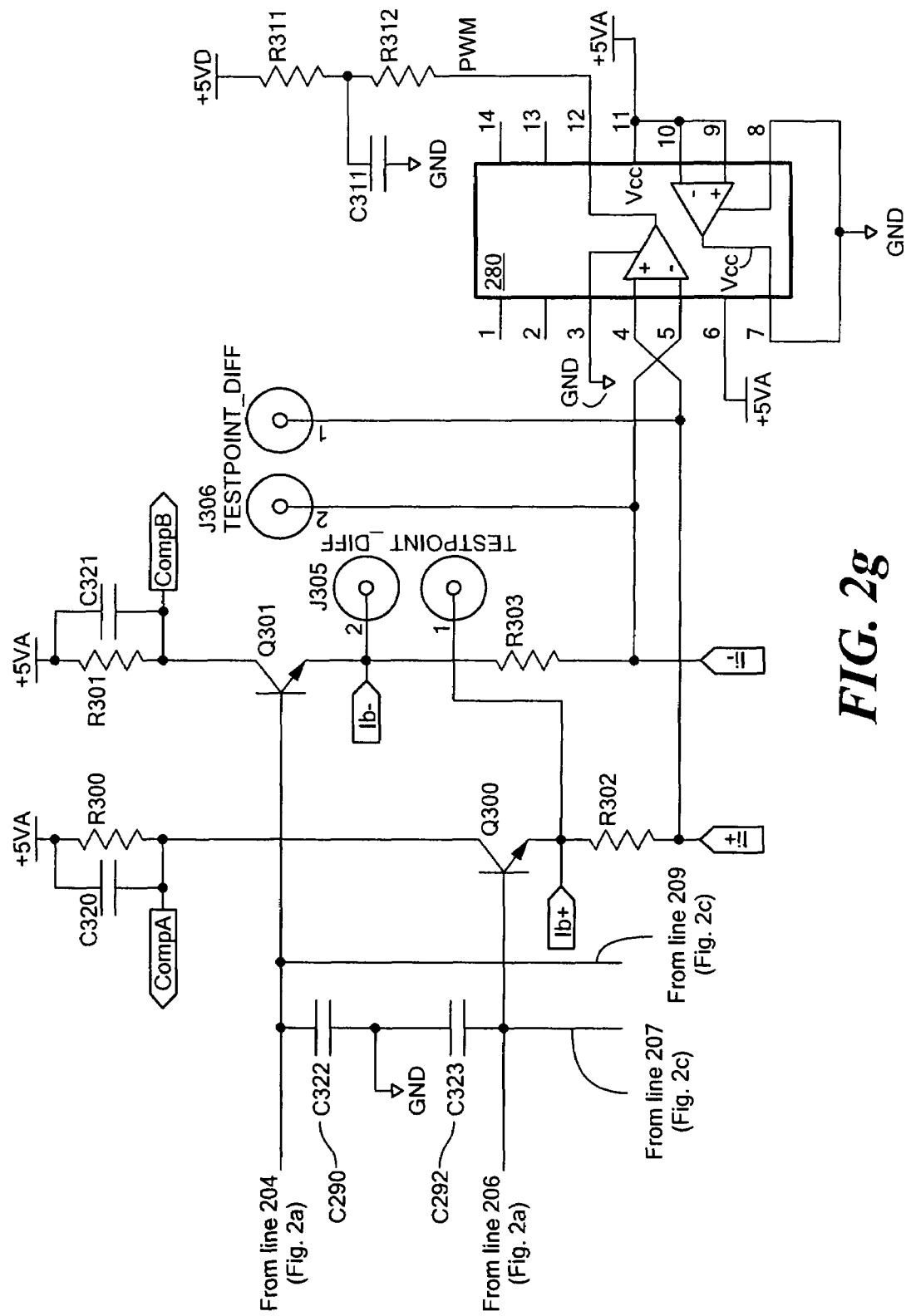
FIG. 2g is a schematic diagram of auxiliary circuitry employed in conjunction with the driver/amplifier circuitry of FIG. 2a and the common-mode and DC balance circuitry of FIG. 2b.

It is noted that the driver/amplifier circuitry 200 is configured to generate a compressor reference level, which is accomplished using a simple resistor DAC, as depicted in FIG. 2f. A switch 214 allows the automatic level controller to be disabled by greatly increasing the reference level. Further, a diode 216 isolates the relatively long and possibly noise-prone line from the switch 214.

Figure 3A:
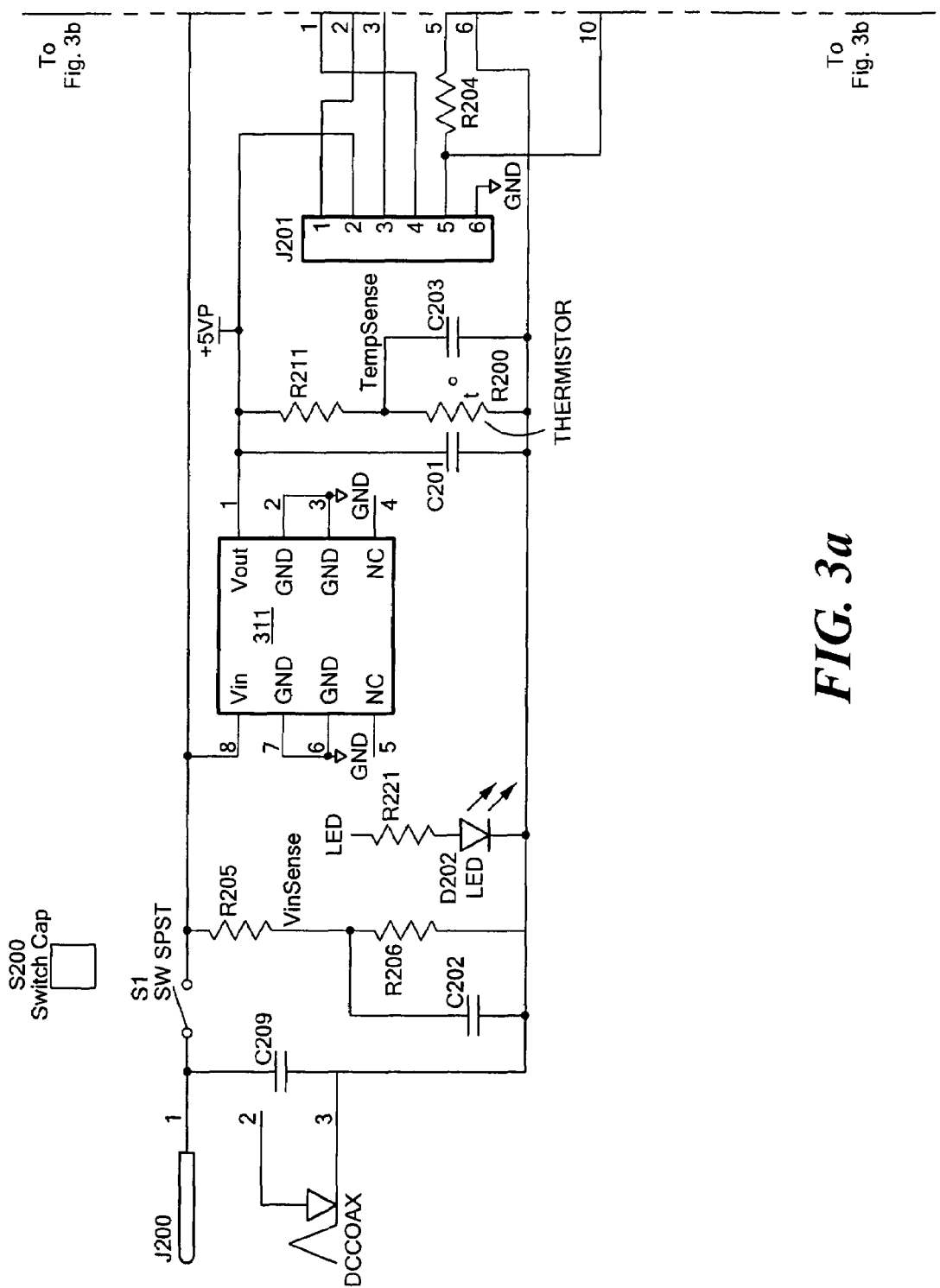
FIGS. 3a-3b are schematic diagrams of protection circuitry included in the capacitive load driving device of FIG. 1.
Figure 3B:
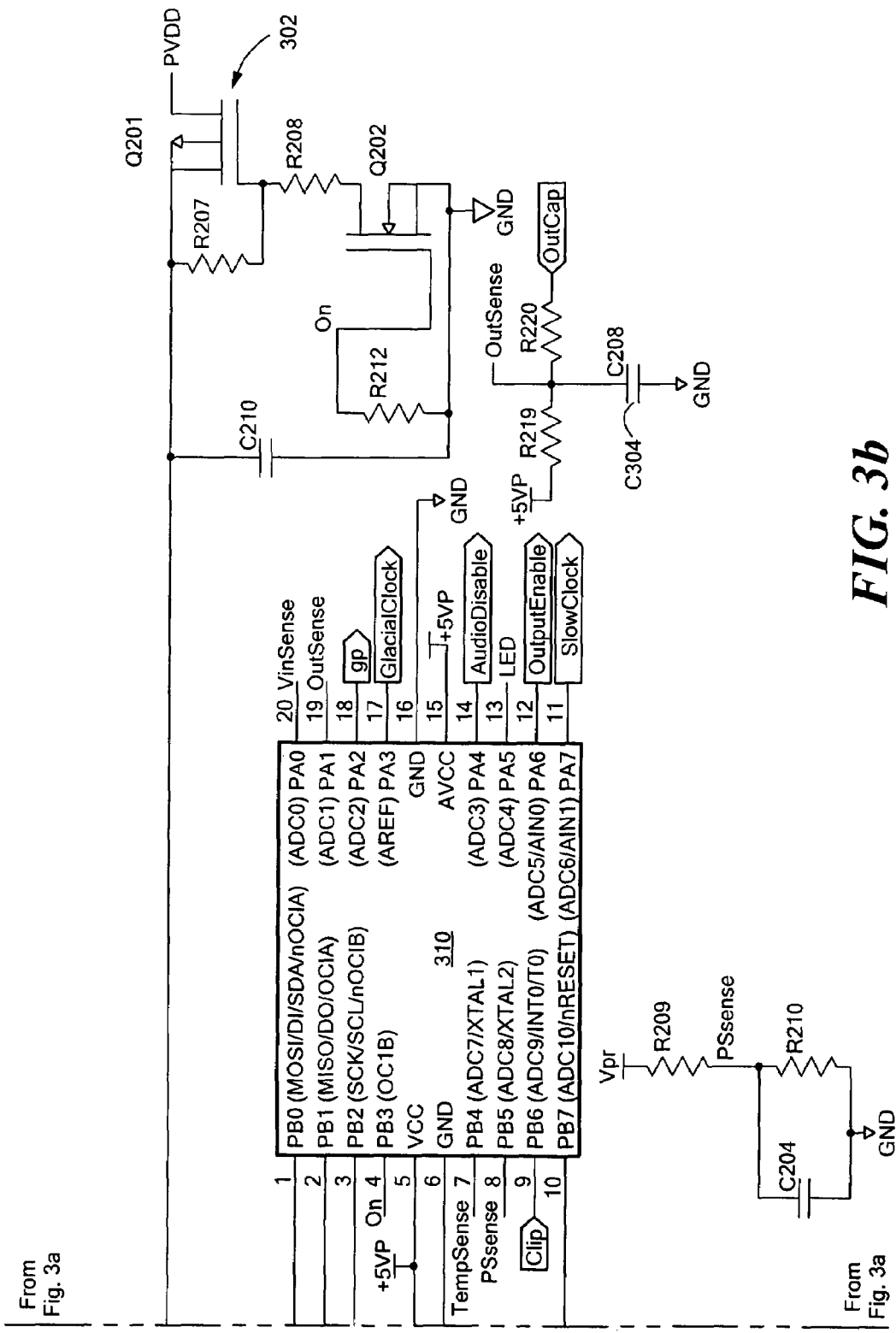

As shown in FIGS. 3a-3b, the protection circuitry 300 includes a microcontroller 310, and a regulator 311. The protection circuitry 300 is configured to control power to the rest of the capacitive load driving device 100 using a MOSFET 302. Although it requires programming, the microcontroller 310 reduces costs, board space, and the total number of parts, and allows solderless changes to various thresholds, time delays, and startup sequences. If desired, the microcontroller 310 may be employed to implement software filters and other processing tasks. The microcontroller 310 can also be configured to flash "fault codes" on a display (not shown) to let the user know what fault condition caused a shutdown.

In the presently disclosed embodiment, the microcontroller 310 monitors six fault conditions, namely, transducer absent, input voltage too low, input voltage too high, over-temperature, internal pre-regulator voltage too low, and internal pre-regulator voltage too high. All of these fault conditions can cause the overall system to shut down. For all but a missing transducer, the capacitive load driving device 100 must be powered down before it will restart, however, this can be determined in software. Over-current protection can be handled by the external supply. It is noted that a drooping supply voltage will also cause the system to shut down. The transducer absent fault condition is perhaps most important, as it helps to prevent the user (or incorrectly connected equipment) from receiving drive voltage, which could cause damage or pose a safety hazard. In the illustrated embodiment, the system will power up only when it recognizes a valid transducer connection.

The protection circuitry 300 can interface with rest of the system in several ways. For example, there are lines for Output Enable, Audio Disable, and three lines for clocks (gp, SlowClock, GlacialClock) or other uses. After startup, the Output Enable followed by the Input Enable are turned on in sequence to avoid any unwanted pops and "clicks" on startup.

Figure 4A:
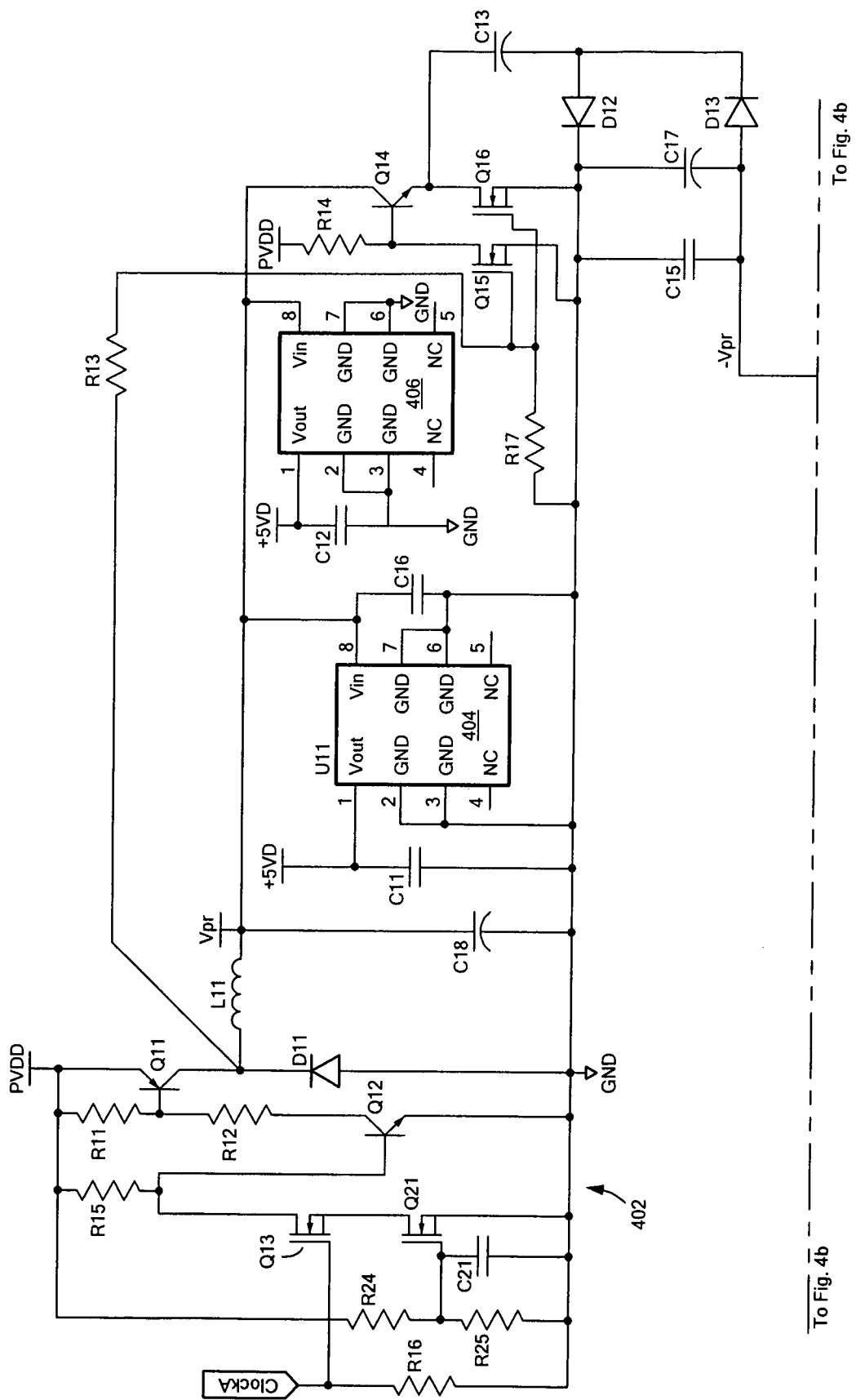
FIGS. 4a-4b are schematic diagrams of power supply circuitry included in the capacitive load driving device of FIG. 1.
Figure 4B:
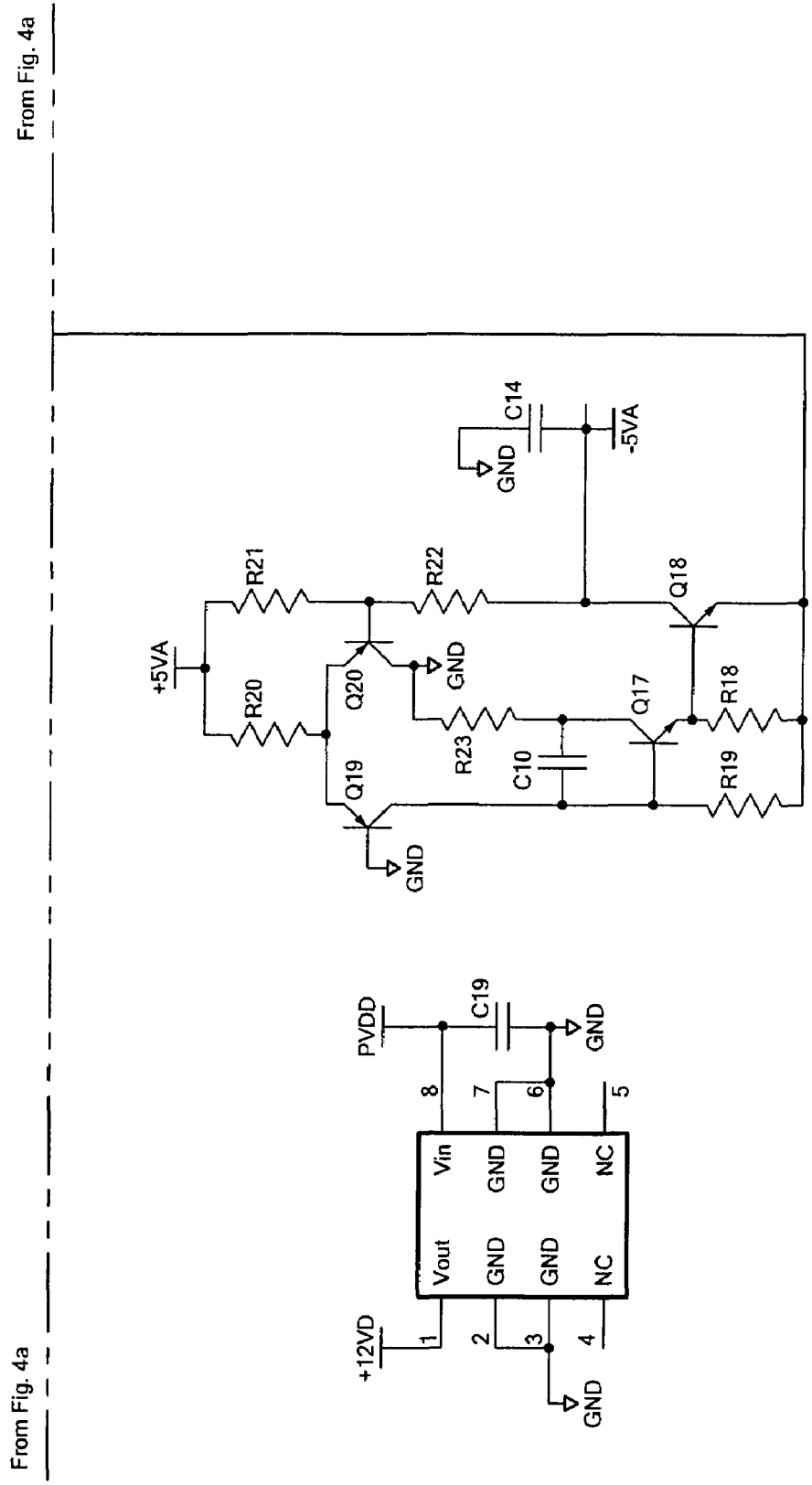

As shown in FIGS. 4a-4b, the internal power supply circuitry 400 includes a switching pre-regulator 402 followed by linear regulators 404, 406 to keep power dissipation low. The configuration of the power supply circuitry 400 is a buck regulator, which is clocked at the carrier frequency. Synchronous clocking allows the transitions to be placed where they will not interfere with the rest of the circuit. The duty cycle is constant, so the pre-regulator output is a constant fraction of the input voltage (e.g., ⅓), minus device losses. In the illustrated embodiment, a low-current +12V supply is derived directly from a 24V input. The pre-regulator 402 feeds the separate analog and digital +5V regulators 406, 404, plus a charge pump that generates a negative voltage to feed the −5V analog regulator. It is noted that the buck pre-regulator is kept high by a transistor Q21 while the overall circuit is powering up.

The peak detect function turns the differential signal from the processing section into a DC level, which in turn feeds a leaky integrator 211 (see FIG. 2d). This integrator 211 has moderate gain to regulate the volume level, but also allows the level control to have some effect, even when the level controller is operating. A diode D217 allows a faster attack time on quickly rising transients. The comparator reference level is generated in the processing section. The sum of the automatic level control output and the user-set level control feeds the voltage controlled amplifier, which, in the illustrated embodiment, is implemented within the EQ/compression functional block 700 (see FIG. 1).

Figure 5A:
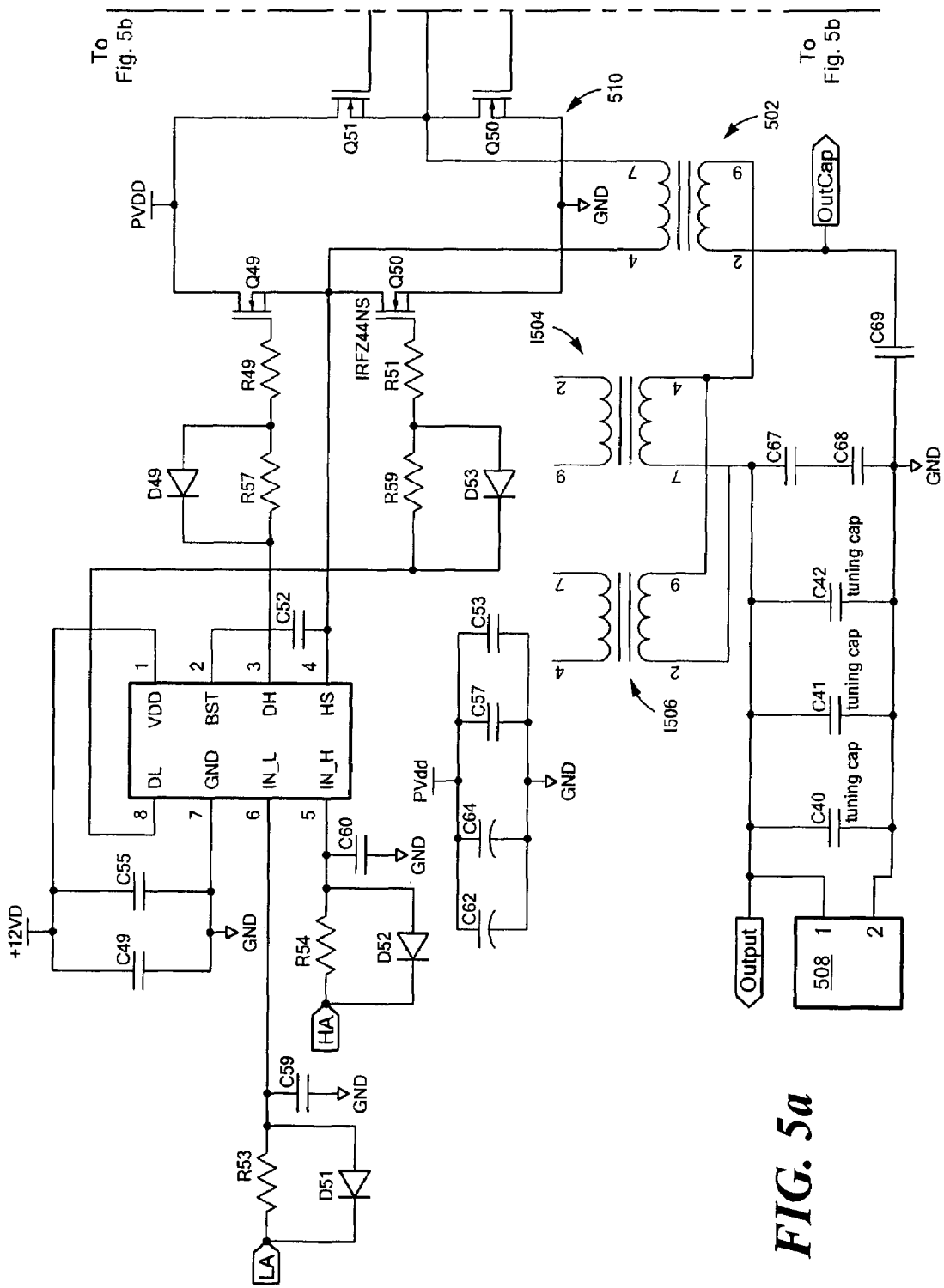
FIGS. 5a-5b are schematic diagrams of an output stage included in the capacitive load driving device of FIG. 1.
Figure 5B:
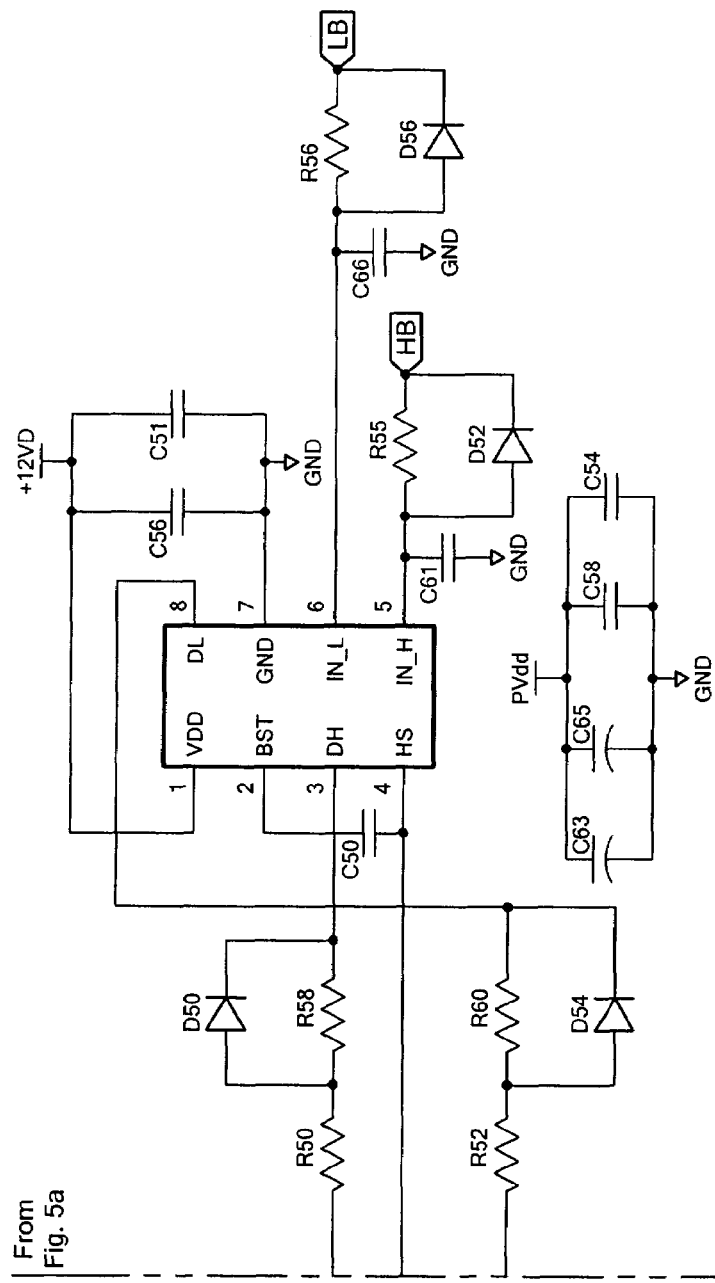

As shown in FIGS. 5a-5b, the output stage 500 includes the H-bridge 510 that provides bipolar drive using four N-channel MOSFETs for best performance. The H-bridge 510 is like the H-bridge configuration disclosed in U.S. Pat. No. 6,661, 285 issued Dec. 9, 2003 entitled POWER EFFICIENT CAPACITIVE LOAD DRIVING DEVICE, the entire disclosure of which is incorporated herein by reference. In the illustrated embodiment, the H-bridge 510 drives a transformer 502, which operates to match impedances and allows the output to be single-ended. The output tank includes the capacitive transducer (not shown; the capacitive transducer can be connected remotely through a connector 508) and a series inductor I504 or I506. For example, the Q of this combination is roughly 10. This sharp response helps generate the large AC output voltage of the system, and, combined with the second-order low-pass response, filters out the harmonics of the discrete sine wave. The output is capacitively coupled to ground, and a small DC voltage is coupled into the capacitor C304 (see FIG. 3*b*) by the protection circuitry 300. When a capacitive transducer is connected, the DC voltage is pulled to zero by the transducer's inductor. The protection circuitry 300 uses this voltage change to detect the presence/absence of the transducer.

It should be understood that the implementation of the capacitive load driving device 100, as described herein, is presented for purposes of illustration. Further, the various functional block diagrams and schematic diagrams, as described herein, are provided to illustrate the implementation in a general sense, and are not meant to be limiting.

In addition, the functionality of the capacitive load driving device 100 has been described above with reference to parabolic waveforms; however, other curves may be employed that better model nonlinear propagation distortion, for example, the "xatanx" function. It is further noted that frequency modulation can be added to the disclosed scheme at any suitable location in the signal chain to implement a "hybrid" modulation scheme.

In addition, although an H-bridge has been described for use in the output stage for reliability and accuracy, it is understood that a half-bridge, a full bridge, or any other suitable scheme may also be employed.

It will be appreciated by those of ordinary skill in the art that modifications to and variations of the above-described capacitive load driving device may be made without departing from the inventive concepts disclosed herein. Accordingly, the invention should not be viewed as limited except as by the scope and spirit of the appended claims.

What is claimed is:

1. A method of driving a capacitive load, comprising the steps of:

providing an analog input signal;

in a generating step, generating a pulse-width modulated (PWM) waveform, wherein said generating step includes comparing said analog input signal with a specified modulation waveform, thereby modulating and discretizing said analog input signal, the specified modulation waveform comprising a series of approximately parabolic waveforms;

processing said PWM waveform to generate a discrete low-harmonic sine wave approximation;

producing a plurality of drive signals from said discrete low-harmonic sine wave approximation;

applying said plurality of drive signals to a plurality of switches, respectively, said plurality of switches being coupleable to said capacitive load; and in response to applying said plurality of drive signals to said plurality of switches, respectively, driving said capacitive load by switchingly connecting said capacitive load between a source output and a reference potential to charge said capacitive load positively, and to discharge said capacitive load or charge said capacitive load negatively.

2. The method of claim 1 wherein said analog input signal has a positive half-cycle and a negative half-cycle, and wherein said generating step further includes employing a first pulse and a second pulse in each of said positive half-cycle and said negative half-cycle of said analog input signal to generate said PWM waveform.

3. The method of claim 2 wherein said first and second pulses employed in said positive half-cycle of said analog input signal are centered at about $\pi/3$ and $2\pi/3$ radians relative to a complete cycle of said analog input signal.

4. The method of claim 2 wherein said first and second pulses employed in said negative half-cycle of said analog input signal are centered at about $4\pi/3$ and $5\pi/3$ radians relative to a complete cycle of said analog input signal.

5. The method of claim 1 wherein said capacitive load comprises one of an antenna and a capacitive transducer.

* * * * *